United States Patent
Peng

(10) Patent No.: US 10,862,035 B2
(45) Date of Patent: Dec. 8, 2020

(54) FLEXIBLE ORGANIC LIGHT EMITTING DIODE DISPLAY AND MANUFACTURING METHOD OF SAME

(71) Applicant: WUHAN CHINA STAR OPTOELECTRONICS SEMICONDUCTOR DISPLAY TECHNOLOGY CO., LTD., Hubei (CN)

(72) Inventor: Zhewei Peng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 17 days.

(21) Appl. No.: 16/462,229

(22) PCT Filed: Nov. 6, 2018

(86) PCT No.: PCT/CN2018/114098
§ 371 (c)(1),
(2) Date: May 19, 2019

(87) PCT Pub. No.: WO2019/237644
PCT Pub. Date: Dec. 19, 2019

(65) Prior Publication Data
US 2020/0203611 A1    Jun. 25, 2020

(30) Foreign Application Priority Data
Dec. 6, 2018 (CN) .......................... 2018 1 0599940

(51) Int. Cl.
*H01L 51/00* (2006.01)
*H01L 51/56* (2006.01)

(52) U.S. Cl.
CPC ........ *H01L 51/0017* (2013.01); *H01L 51/003* (2013.01); *H01L 51/0097* (2013.01); *H01L 51/56* (2013.01)

(58) Field of Classification Search
None
See application file for complete search history.

(56) References Cited

U.S. PATENT DOCUMENTS

2011/0159773 A1*  6/2011  Jung ............... H01L 51/5246
                                                       445/25
2018/0287080 A1* 10/2018  Wang ................ H01L 27/32
(Continued)

FOREIGN PATENT DOCUMENTS

CN       107507929 A     12/2017
CN       107556966 A      1/2018
(Continued)

OTHER PUBLICATIONS

Certified copy of the foreign application CN 201810599940.5 filed in china on Dec. 6, 2018 (Year: 2018).*
(Continued)

*Primary Examiner* — Grant S Withers
(74) *Attorney, Agent, or Firm* — Mark M. Friedman

(57) ABSTRACT

The present disclosure provides a flexible organic light emitting diode display and a manufacturing method thereof. The manufacturing method includes: a polyimide film, a buffer layer, a switch array layer, as well as an organic light emitting display layer successively located below the polyimide film in that a starting material of the buffer layer is doped with a light absorbing material. A stripping laser is configured to separate the polyimide film from a glass substrate used during manufacturing, so as to obtain a flexible organic light emitting diode display.

17 Claims, 2 Drawing Sheets

(56) References Cited

U.S. PATENT DOCUMENTS

2019/0013366 A1  1/2019  Forrest et al.
2019/0044079 A1  2/2019  Qin

FOREIGN PATENT DOCUMENTS

CN    108054290 A    5/2018
WO    2015081289 A1  6/2015

OTHER PUBLICATIONS

English translation of CN 107507929 published Dec. 22, 2017 (Year: 2017).*

* cited by examiner

FLEXIBLE ORGANIC LIGHT EMITTING DIODE DISPLAY AND MANUFACTURING METHOD OF SAME

FIELD OF INVENTION

The present invention relates to a display technology, and more particularly, to an organic light emitting diode display and a manufacturing method of same.

BACKGROUND OF INVENTION

Flexible organic light emitting diode (OLED) displays have broad application prospects in the field of wearable devices due to their foldable properties and low-power consumption. As shown in FIG. 1 and FIG. 2, the manufacturing process of current flexible OLED displays comprises steps of: producing a flexible polyimide (PI) film 12 below a glass substrate 11, and then producing a switch array layer 13 and an organic light emitting display layer 14, and finally separating the glass substrate 11 and the polyimide film 12 by a laser 101 (laser lift off, LLO) to obtain a flexible display.

However, current laser stripping technology uses a laser with a wavelength of 308 nm that cannot be absorbed by the polyimide film and thus the laser can pass through a buffer layer and transmit to the switch array layer below the buffer layer so that switching elements are damaged thereby increasing production costs and reducing display effect of the display.

It is therefore necessary to provide a flexible organic light emitting diode display and a manufacturing method thereof in order to solve the problems existing in the conventional technology.

SUMMARY OF INVENTION

An object of the present invention is to provide a flexible organic light emitting diode display and a manufacturing method thereof to increase the resolution of the flexible organic light emitting diode display.

To solve the above technical problems, the present invention provides a flexible organic light emitting diode display, comprising:
a polyimide film;
a buffer layer located below the polyimide film, wherein a starting material of the buffer layer is doped with a light absorbing material, and the light absorbing material is configured to absorb a stripping laser for protecting switch elements; wherein the stripping laser is configured to separate the polyimide film from a glass substrate used during manufacturing, so as to obtain a flexible organic light emitting diode display; the light absorbing material includes a Ti-MOF material; and the starting material includes at least one of SiO2 and $SiN_x$;
a switch array layer located below the buffer layer, wherein the switch array layer includes a plurality of the switch elements; and
an organic light emitting display layer located below the switch array layer, wherein the organic light emitting display layer includes a plurality of organic light emitting units.

In the flexible organic light emitting diode display of the present invention, the stripping laser has a wavelength within a wavelength range of absorbable light of the light absorbing material.

In the flexible organic light emitting diode display of the present invention, the wavelength of the stripping laser is 308 nm, and the wavelength range of the absorbable light of the light absorbing material is from 260 nm to 350 nm.

In the flexible organic light emitting diode display of the present invention, the starting material and the light absorbing material are mixed by a mixing ratio within a predetermined range.

In the flexible organic light emitting diode display of the present invention, the light absorbing material and the starting material are mixed by the mixing ratio ranging from 3:1 to 5:1.

In the flexible organic light emitting diode display of the present invention, the buffer layer has a thickness ranging from 2 nm to 10 nm.

In the flexible organic light emitting diode display of the present invention, further comprising: an organic composite layer located below the organic light emitting display layer.

In the flexible organic light emitting diode display of the present invention, the organic composite layer has a thickness ranging from 0.5 μm to 2 μm.

The present invention provides a flexible organic light emitting diode display, comprising:
a polyimide film;
a buffer layer located below the polyimide film; wherein a starting material of the buffer layer is doped with a light absorbing material, and the light absorbing material is configured to absorb a stripping laser for protecting switch elements, wherein the stripping laser is configured to separate the polyimide film from a glass substrate used during manufacturing, so as to obtain a flexible organic light emitting diode display;
a switch array layer located below the buffer layer, wherein the switch array layer includes a plurality of the switch elements; and
an organic light emitting display layer located below the switch array layer, wherein the organic light emitting display layer includes a plurality of organic light emitting units.

In the flexible organic light emitting diode display of the present invention, the light absorbing material includes a Ti-MOF material.

In the flexible organic light emitting diode display of the present invention, the starting material includes at least one of $SiO_2$ and $SiN_x$.

In the flexible organic light emitting diode display of the present invention, the stripping laser has a wavelength within a wavelength range of absorbable light of the light absorbing material.

In the flexible organic light emitting diode display of the present invention, the wavelength of the stripping laser is 308 nm, and the wavelength range of the absorbable light of the light absorbing material is from 260 nm to 350 nm.

In the flexible organic light emitting diode display of the present invention, the starting material and the light absorbing material are mixed by a mixing ratio within a predetermined range.

In the flexible organic light emitting diode display of the present invention, the light absorbing material and the starting material are mixed by the mixing ratio ranging from 3:1 to 5:1.

In the flexible organic light emitting diode display of the present invention, the buffer layer has a thickness ranging from 2 nm to 10 nm.

In the flexible organic light emitting diode display of the present invention, further comprising: an organic composite layer located below the organic light emitting display layer.

The present invention further provides a manufacturing method of a flexible organic light emitting diode display, comprising steps of:

forming a polyimide film below a glass substrate;

forming a buffer layer below the polyimide film, wherein a starting material of the buffer layer is doped with a light absorbing material, and the light absorbing material is configured to absorb a stripping laser for protecting switch elements; wherein the stripping laser is configured to separate the polyimide film from the glass substrate;

producing a switch array layer below the buffer layer, wherein the switch array layer includes a plurality of the switch elements; and producing an organic light emitting display layer below the switch array layer, wherein the organic light emitting display layer includes a plurality of organic light emitting units; and using the stripping laser to separate the polyimide film from the glass substrate to obtain a flexible organic light emitting diode display.

In the manufacturing method of a flexible organic light emitting diode display according to the present invention, the light absorbing material includes a Ti-MOF material.

In the manufacturing method of a flexible organic light emitting diode display according to the present invention, the stripping laser has a wavelength within a wavelength range of absorbable light of the light absorbing material.

The flexible organic light emitting diode display and the manufacturing method thereof are provided by adding a light absorbing material into the current buffer layer. Because the light absorbing material can absorb the stripping laser, the damage of the switching elements can be avoided during stripping the polyimide film from the glass substrate that rendering the producing cost decreasing and display effect increasing.

DETAILED DESCRIPTION OF PREFERRED EMBODIMENTS

Figure 1:
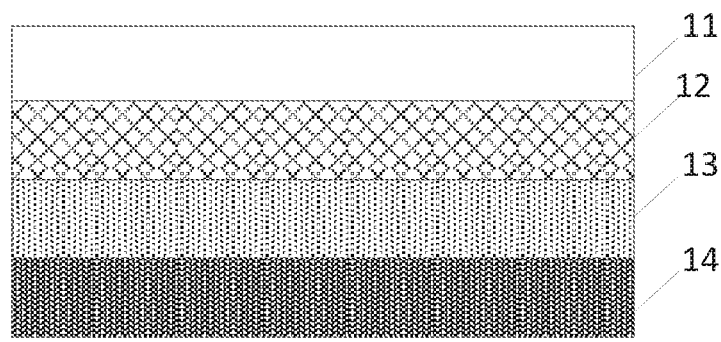
FIG. 1 is a schematic view of a structure of a conventional organic light emitting diode (OLED) display.
Figure 2:
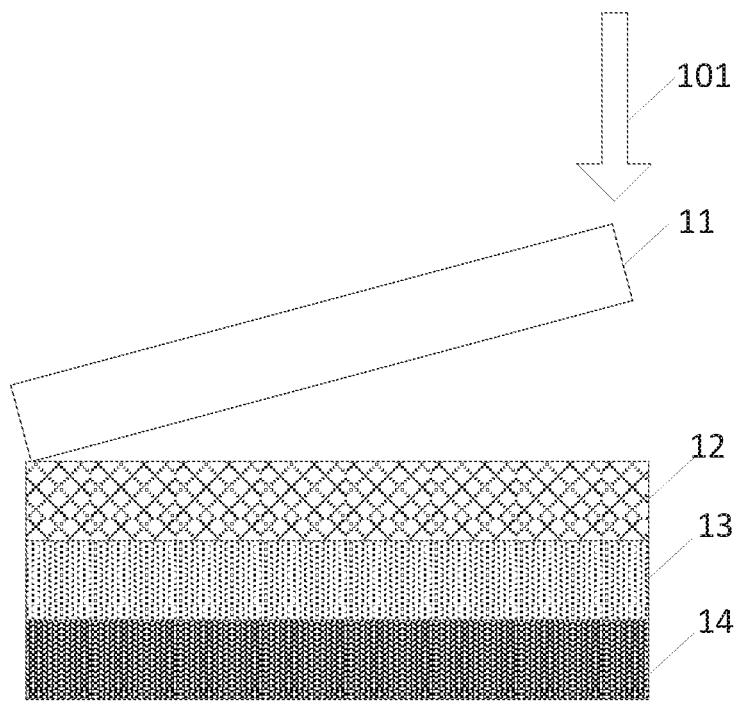
FIG. 2 shows a schematic view of a structure of a conventional OLED display which is subjected to stripping.

The description of the following embodiments is used for exemplifying the specific embodiments of the present invention by referring to the accompany drawings. Furthermore, directional terms described by the present invention, such as upper, lower, front, back, left, right, inner, outer, side, etc., are only directions by referring to the accompanying drawings, and thus the directional terms are used to describe and understand the present invention, but the present invention is not limited thereto. In the drawings, like reference numerals designate like elements throughout the specification.

Figure 3:
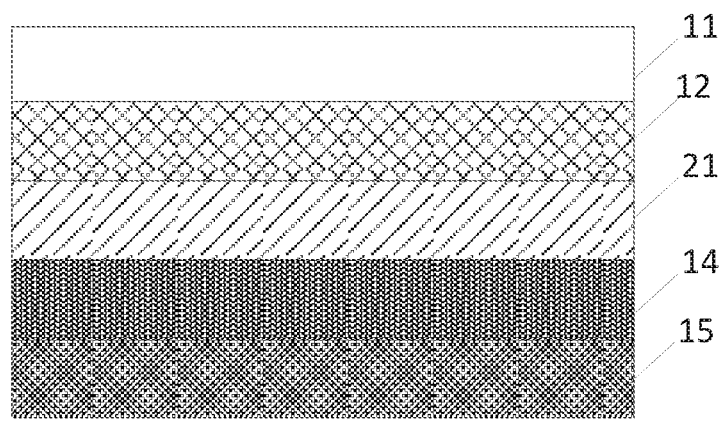
FIG. 3 is a schematic view of a structure of an OLED display according to the present invention.

Referring to FIG. 3, which shows a structural schematic view of an organic light emitting diode (OLED) display according to the present invention.

The OLED display in the present invention is used for forming a flexible OLED display. The OLED display includes a glass substrate 11, a polyimide film 12, a buffer layer 21, a switch array layer 14, and an organic light emitting display layer 15.

The polyimide film 12 is located below the glass substrate 11.

The buffer layer 21 is located below the polyimide film 12. A starting material of the buffer layer 21 is doped with a light absorbing material, and the light absorbing material is configured to absorb a stripping laser for protecting switch elements; wherein the stripping laser is configured to separate the polyimide film from a glass substrate, so as to obtain a flexible organic light emitting diode display. The stripping laser is, for example, ultraviolet light.

It is characterized in that starting material includes at least one of $SiO_2$ and $SiN_x$. Because the above starting material is applied to the buffer layer 21, the above starting material can not only improve the insulation of the buffer layer, but also enhance the absorption of the bending deformation force of the buffer layer to prevent the substrate from being damaged during the bending process.

It is characterized in that the light absorbing material includes a titanium-based metal organic framework (Ti-MOF) material. In one embodiment, the buffer layer 21 is further doped by the Ti-MOF material in addition to $SiO_2$ or $SiN_x$. The Ti-MOF material is obtained by reacting bis (acetylacetonyl)diisopropyl titanate and terephthalic acid under a suitable condition. The particle size of the Ti-MOF material is 500-700 nm.

Because Ti-MOF has a larger specific surface area, it can sufficiently contact the ultraviolet light. In addition, the maximum absorption wavelength of Ti-MOF is at about 300 nm, which can match to the wavelength of the stripping laser. Thus, even if there is excess ultraviolet light passing through the buffer layer 21, the buffer layer 21 can absorb it, thereby preventing the switching elements below the buffer layer 21 from being burned. Moreover, MOF is porous so that it allows the material to have more effective contact with the laser per unit volume. This structure can ensure the light absorption without increasing the thickness of the buffer layer, thereby facilitating the thinning of the flexible organic light emitting diode display.

Preferably, in order to improve the effect of the laser absorption of the buffer layer to further avoid the damage of the switching elements, the starting material and the light absorbing material are mixed by a mixing ratio within a predetermined range. For example, $SiO_2$ and Ti-MOF are mixed by the mixing ratio ranging from 3:1 to 5:1. $SiN_x$ and Ti-MOF are mixed by the mixing ratio ranging from 3:1 to 5:1.

Preferably, in order to improve the effect of the laser absorption of the buffer layer to further avoid the damage of the switching elements, the stripping laser has a wavelength within a wavelength range of absorbable light of the light absorbing material. In one embodiment, the wavelength of the stripping laser is 308 nm, and the wavelength range of the absorbable light of the light absorbing material is from 260 nm to 350 nm.

The buffer layer in the present invention has a thickness ranging from 2 nm to 10 nm, that is, the thickness of the buffer layer is within a predetermined range, and approximately the thickness of the current buffer layer. Because the thickness is within this range, the switching elements can be well protected and the increase of the dimension of the display can be avoided.

The switch array layer 14 is located below the buffer layer 21. The switch array layer 14 includes a plurality of the switch elements. The switch array layer 14 has a plurality of switching elements, such as thin film transistors including an active layer for forming trenches, a gate insulating layer, a first metal layer, an interlayer insulating layer, and a second metal layer.

The organic light emitting display layer 15 is located below the switch array layer 14. The organic light emitting display layer 15 includes a plurality of organic light emitting units, in that the organic light emitting units are electrically connected with the switch array layer 14, specifically the organic light emitting units connect with drain electrodes of the thin film transistors.

It can be understood that the OLED display in present invention further includes an organic composite layer (not shown). The organic composite layer is located below the organic light emitting display layer 15. The organic composite layer has a thickness ranging from 0.5 μm to 2 μm. Due to the thickness is within this range, it can better block the outside water and the thickness of the display is not increased.

Material of the organic composite layer includes an organic material and inorganic nanoparticles evenly distributed in the organic material for forming a nano-organic composite layer with a refractive index more than 1.8.

The inorganic nanoparticles include at least one of metal oxides or sulfide, and non-metal oxide or sulfide.

The organic material can be at least one of acrylic, epoxy resins, and an organic silicone material. In addition, the organic composite layer can further increase the luminous efficiency of the organic light emitting diode.

The present invention further provides a manufacturing method of a flexible organic light emitting diode display, comprising steps of:

(S101) forming a polyimide film below a glass substrate.

For example, polyimide is coated below the glass substrate and then cured to form a polyimide film.

(S102) forming a buffer layer below the polyimide film, wherein a starting material of the buffer layer is doped with a light absorbing material, and the light absorbing material is configured to absorb a stripping laser for protecting switch elements;

the stripping laser is configured to separate the polyimide film from the glass substrate, and the stripping laser is, for example, ultraviolet light.

(S103) producing a switch array layer below the buffer layer, wherein the switch array layer includes a plurality of the switch elements;

The switch array layer 14 has a plurality of thin film transistors which are provided by a specific step of successively forming an active layer for forming trenches, a gate insulating layer, a first metal layer, an interlayer insulating layer, and a second metal layer below the buffer layer 21 to obtain the switch array layer 14.

(S104) producing an organic light emitting display layer below the switch array layer, wherein the organic light emitting display layer includes a plurality of organic light emitting units.

For example, successively forming an anode, an organic light emitting layer, and a cathode below the switch array layer to obtain the organic light emitting display layer 15.

(S105) using a stripping laser to separate the polyimide film from the glass substrate so as to obtain a flexible organic light emitting diode display.

For example, the polyimide film 12 and the glass substrate 11 are separated by ultraviolet light to obtain the flexible organic light emitting diode display.

It is characterized that the starting material includes at least one of $SiO_2$ and $SiN_x$. Because the above starting material is applied to the buffer layer, the buffer layer can not only improve the insulation of the buffer layer, but also enhance the absorption of the bending deformation force of the buffer layer to prevent the substrate from being damaged during the bending process.

It is characterized that the light absorbing material includes a Ti-MOF material. In one embodiment, the buffer layer 21 is further doped by the Ti-MOF material in addition to $SiO_2$ or $SiN_x$. The Ti-MOF material is obtained by reacting bis(acetylacetonyl)diisopropyl titanate and terephthalic acid under a suitable condition. The dimension of the Ti-MOF material is 500-700 nm.

Because Ti-MOF has larger specific surface area, it can sufficiently contact the ultraviolet light. In addition, the maximum absorption wavelength of Ti-MOF is at about 300 nm, which can match to the wavelength of the stripping laser. Thus, even if there is excess ultraviolet light passing through the buffer layer 21, the buffer layer 21 can absorb it, thereby preventing the switching elements below the buffer layer 21 from being burned. Moreover, MOF is porous so that it allows the material to have more effective contact with the laser per unit volume. This structure can ensure the light absorption without increasing the thickness of the buffer layer, thereby facilitating the thinning of the flexible organic light emitting diode display.

Preferably, in order to improve the effect of the laser absorption of the buffer layer to further avoid the damage of the switching elements, the starting material and the light absorbing material are mixed by a mixing ratio within a predetermined range. For example, $SiO_2$ and Ti-MOF are mixed by the mixing ratio ranging from 3:1 to 5:1. $SiN_x$ and Ti-MOF are mixed by the mixing ratio ranging from 3:1 to 5:1.

Preferably, in order to improve the effect of the laser absorption of the buffer layer to further avoid the damage of the switching elements, the stripping laser has a wavelength within a wavelength range of absorbable light of the light absorbing material. In one embodiment, the wavelength of the stripping laser is 308 nm, and the wavelength range of the absorbable light of the light absorbing material is from 260 nm to 350 nm.

The buffer layer in the present invention has a thickness ranging from 2 nm to 10 nm. That is, the thickness of the buffer layer is within a predetermined range, and approximately the thickness of the current buffer layer. Because the thickness is within this range, the switching elements can be well protected and the increase of the dimension of the display can be avoided.

The flexible organic light emitting diode display and the manufacturing method thereof are provided by adding a light absorbing material into the current buffer layer. Because the light absorbing material can absorb the stripping laser, the damage of the switching elements can be avoided during stripping the polyimide film from the glass substrate that rendering the producing cost decreasing and display effect increasing.

As such, the present invention has been described with preferred embodiments as above, but the above preferred embodiments are not intended for limiting the present invention. It is understood that many changes and modifications to the described embodiments can be carried out by the skilled person in the art without departing from the scope and the spirit of the invention that is intended to be limited only by the appended claims.

What is claimed is:

1. A flexible organic light emitting diode display, comprising:
    a polyimide film;
    a buffer layer located below the polyimide film, wherein a starting material of the buffer layer is doped with a light absorbing material, and the light absorbing material is configured to absorb a stripping laser for protecting switch elements; wherein the stripping laser is configured to separate the polyimide film from a glass substrate used during manufacturing, so as to obtain a flexible organic light emitting diode display; the light absorbing material includes a titanium-based metal organic framework material; and the starting material includes at least one of $SiO_2$ and $SiN_x$;

a switch array layer located below the buffer layer, wherein the switch array layer includes a plurality of the switch elements; and an organic light emitting display layer located below the switch array layer, wherein the organic light emitting display layer includes a plurality of organic light emitting units.

2. The flexible organic light emitting diode display according to claim 1, wherein the stripping laser has a wavelength within a wavelength range of absorbable light of the light absorbing material.

3. The flexible organic light emitting diode display according to claim 2, wherein the wavelength of the stripping laser is 308 nm, and the wavelength range of the absorbable light of the light absorbing material is from 260 nm to 350 nm.

4. The flexible organic light emitting diode display according to claim 1, wherein the starting material and the light absorbing material are mixed by a mixing ratio within a predetermined range.

5. The flexible organic light emitting diode display according to claim 4, wherein the light absorbing material and the starting material are mixed by the mixing ratio ranging from 3:1 to 5:1.

6. The flexible organic light emitting diode display according to claim 1, wherein the buffer layer has a thickness ranging from 2 nm to 10 nm.

7. The flexible organic light emitting diode display according to claim 1, further comprising: an organic composite layer located below the organic light emitting display layer.

8. The flexible organic light emitting diode display according to claim 7, wherein the organic composite layer has a thickness ranging from 0.5 μm to 2 μm.

9. A flexible organic light emitting diode display, comprising:

a polyimide film;

a buffer layer located below the polyimide film; wherein a starting material of the buffer layer is doped with a light absorbing material, and the light absorbing material is configured to absorb a stripping laser for protecting switch elements, wherein the stripping laser is configured to separate the polyimide film from a glass substrate used during manufacturing, so as to obtain a flexible organic light emitting diode display; the light absorbing material includes a titanium-based metal organic framework material;

a switch array layer located below the buffer layer, wherein the switch array layer includes a plurality of the switch elements; and an organic light emitting display layer located below the switch array layer, wherein the organic light emitting display layer includes a plurality of organic light emitting units.

10. The flexible organic light emitting diode display according to claim 9, wherein the stripping laser has a wavelength within a wavelength range of absorbable light of the light absorbing material.

11. The flexible organic light emitting diode display according to claim 10, wherein the wavelength of the stripping laser is 308 nm, and the wavelength range of the absorbable light of the light absorbing material is from 260 nm to 350 nm.

12. The flexible organic light emitting diode display according to claim 9, wherein the starting material and the light absorbing material are mixed by a mixing ratio within a predetermined range.

13. The flexible organic light emitting diode display according to claim 12, wherein the light absorbing material and the starting material are mixed by the mixing ratio ranging from 3:1 to 5:1.

14. The flexible organic light emitting diode display according to claim 9, wherein the buffer layer has a thickness ranging from 2 nm to 10 nm.

15. The flexible organic light emitting diode display according to claim 9, further comprising: an organic composite layer located below the organic light emitting display layer.

16. A manufacturing method of a flexible organic light emitting diode display, comprising steps of:

forming a polyimide film below a glass substrate;

forming a buffer layer below the polyimide film, wherein a starting material of the buffer layer is doped with a light absorbing material, and the light absorbing material is configured to absorb a stripping laser for protecting switch elements; wherein the light absorbing material includes a titanium-based metal organic framework material, and the stripping laser is configured to separate the polyimide film from the glass substrate;

producing a switch array layer below the buffer layer, wherein the switch array layer includes a plurality of the switch elements; and producing an organic light emitting display layer below the switch array layer, wherein the organic light emitting display layer includes a plurality of organic light emitting units; and using the stripping laser to separate the polyimide film from the glass substrate to obtain a flexible organic light emitting diode display.

17. The manufacturing method of the flexible organic light emitting diode display according to claim 16, wherein the stripping laser has a wavelength within a wavelength range of absorbable light of the light absorbing material.

* * * * *

UNITED STATES PATENT AND TRADEMARK OFFICE
CERTIFICATE OF CORRECTION

PATENT NO. : 10,862,035 B2
APPLICATION NO. : 16/462229
DATED : December 8, 2020
INVENTOR(S) : Zhewei Peng It is certified that error appears in the above-identified patent and that said Letters Patent is hereby corrected as shown below:

On the Title Page

Item (30) should be added as follows:
Foreign Application Priority Data
June. 12, 2018 (CN)................................ 201810599940.5

Signed and Sealed this
Eighteenth Day of October, 2022

Katherine Kelly Vidal
*Director of the United States Patent and Trademark Office*